United States Patent [19]
Etzkorn et al.

[11] Patent Number: 5,236,511
[45] Date of Patent: Aug. 17, 1993

[54] PLASMA CVD PROCESS FOR COATING A DOME-SHAPED SUBSTRATE

[75] Inventors: Heinz W. Etzkorn, Neu Anspach; Harald Krümmel; Volker Paquet, both of Mainz; Günter Weidmann, Armsheim, all of Fed. Rep. of Germany

[73] Assignee: Schott Glaswerke, Mainz, Fed. Rep. of Germany

[21] Appl. No.: 784,342

[22] Filed: Oct. 29, 1991

Related U.S. Application Data

[62] Division of Ser. No. 670,420, Mar. 18, 1991, Pat. No. 5,154,943.

[30] Foreign Application Priority Data

Mar. 16, 1990 [DE] Fed. Rep. of Germany ....... 4008405

[51] Int. Cl.$^5$ .............................................. C23C 16/50
[52] U.S. Cl. ..................................... 118/723; 118/715
[58] Field of Search ................................ 118/723, 715

[56] References Cited

U.S. PATENT DOCUMENTS

| | | | |
|---|---|---|---|
| 3,731,650 | 5/1973 | Schweikert et al. | 118/728 |
| 3,926,508 | 12/1975 | Harmsen et al. | 427/255.7 |
| 4,719,873 | 1/1988 | Fujiyama | 118/723 |
| 4,729,341 | 3/1988 | Fournier | 118/723 |
| 4,979,467 | 12/1990 | Kamaji | 118/723 |
| 4,995,341 | 2/1991 | Matsuyama | 118/723 |
| 5,000,113 | 3/1991 | Wang | 118/723 |

FOREIGN PATENT DOCUMENTS 0017296 1/1981 European Pat. Off. .
63-307192 12/1988 Japan .

OTHER PUBLICATIONS

Patent Abstracts of Japan, vol. 13, No. 145, Apr. 10, 1989.

*Primary Examiner*—Richard Bueker
*Attorney, Agent, or Firm*—Millen, White, Zelano, & Branigan

[57] ABSTRACT

A plasma-CVD process and apparatus for coating strongly arched, dome-like substrates with a dielectric and/or metallic coating system on the inside and/or outside face. The thickness of the gas layer to be reacted above the face to be coated is adjusted such as with the aid of the displacement body, so that the extent of the homogeneous reaction or formation occurring in the gas layer during a plasma phase is harmless for the desired coating quality. Strongly arched substrates coated with a uniform coating of highest optical quality and also mechanical, thermal and chemical stability without complicated substrate movement. Specified axial and azimuthal coating thickness profiles can also be superimposed by suitably shaping the displacement body.

7 Claims, 2 Drawing Sheets

PLASMA CVD PROCESS FOR COATING A DOME-SHAPED SUBSTRATE

This is a division of application Ser. No. 07/670,420 filed Mar. 18, 1991 now U.S. Pat. No. 5,154,943.

BACKGROUND OF THE INVENTION

The invention relates to a plasma CVD process for coating, dome-like-shaped substrates or substrates approximating a dome shape, such as reflectors having an inside dielectric cold-light mirror coating. A dielectric and/or metallic coating system can be applied on the inside and/or outside face of such substrates. An apparatus for carrying out the process is also provided.

Reflectors are composed as a rule of arched glass substrates, generally dome-like in shape, having an inside reflection coating. The reflection coating may be composed of a metallic coating or, alternatively, if a specific spectral variation of the reflectivity is desired, of a dielectric coating system. Thus, it is possible to produce, for example, so-called cold-light mirrors, such as for example dental mirrors, which have a high reflectivity only in the visible spectral range but are transmissive for thermal radiation.

Dielectric coating systems having a selective spectral reflecting power are composed, in general, of coatings arranged alternatively one on top of the other and having a high and low reflective index. How such coating systems are to be constructed in detail, i.e., how many coating pairs have to be arranged one on top of the other and how the coating thicknesses are to be dimensioned to achieve a desired optical effect is known to the person skilled in the art and described, for example, in H. A. Macleod, Thin Film: Optical Filters, A. Hilger Ltd., London.

Normally, the dielectric coating systems are applied to the substrates by means of high-vacuum processes such as, for example, high-vacuum vapor deposition, cathode sputtering or electron-beam sputtering. In order to obtain uniform coating of the inside face of the substrate without complicated movement of a strongly arched substrate, a "gas scattering process" (K. Steinfelder et al., Vakuumtechnik 28 (1979), page 48) is as a rule used. In this, the vapor deposition is carried out under elevated pressure (about $10^{-3}$ mbar) of an additive gas which has the object of interrupting the linear movement of the vapor particles from the evaporation source towards the substrate by multiple collisions with the additive gas so that a preferred direction no longer exists in the movement of the vapor particles. So-called "soft" coating systems of $ZnS/MgF_2$ coating pairs which are, however, sensitive to handling and so-called "semi-hard" coating systems of $ZnS/SiO_2$ and $ZnS/Al_2O_3$ coating pairs which, although resistant to handling, are not mechanically loadable, can be produced by this process.

In addition to the gas scattering process, a further high-vacuum vapor deposition process is known (H. K. Pulker, Coatings on Glass, Elsevier, Amsterdam 1984) in which the substrates perform a two-fold rotational movement on planetary mountings during the vapor deposition in order to achieve a uniform coating. Reflectors provided with the coating systems described above (diameter at the dome base approximately 5 cm) have, however, the disadvantage that they fail early at high atmospheric humidity and are not stable enough thermally still to withstand the high heat generated as rule by the halide incandescent lamps usually used, even at electrical powers of over 50 W.

Electron-beam evaporation in high vacuum makes it possible to produce $SiO_2/TiO_2$ coating systems which meet high requirements in relation to their mechanical, chemical and thermal load-carrying capacity and are therefore normally described as so-called "hard" coating system. However, owing to the daily difficult production (for example, complicated substrate movement, substrate heating) these coating systems are several times more expensive on strongly arched substrates than the soft coatings.

SUMMARY OF THE INVENTION

The object of the invention is to provide an inexpensive process which can be carried out simply and which is suitable for providing strongly arched, large-area substrates such as, for example, domes with a dielectric and/or metallic coating system of the highest optical quality and mechanical, thermal and also chemical stability on the inside and/or outside face. In particular, the process should be suitable for producing reflectors having an inside dielectric cold-light mirror coating.

A further object of the invention is to find an apparatus suitable for carrying out the process.

These objects are achieved by a plasma chemical vapor deposition process for coating a substrate with a dielectric and/or metallic coating system on the inside and/or outside face, the improvement comprising adjusting the thickness of the gas layer to be reacted above the face of the substrate to be coated with the aid of a displacement body to maintain the extent of the homogeneous reaction and glass soot formation taking place during the plasma phase at a level such that the coating quality is not affected, i.e., the coating formed does not significantly scatter light. Preferred apparatuses for carrying out the process according to the invention comprise a plasma chemical deposition chamber with displacement bodies to limit the thickness of the gas layer to be deposited.

The plasma CVD processes normally used for the inside coating of tubular glass blanks for producing optical fibers are known per se. A basic description is to be found, for example, in Journal of Optical Communications, vol. 8 (1987), page 122.

Of these processes, the plasma pulse CVD process (in this connection, see for example Journal of Optical Communications, vol. 8 (1987), page 130) in particular is suitable for producing dielectric coating systems with defined optical properties. The plasma pulse CVD process makes it possible to produce very thin uniform coatings down to monomolecular coatings on substrates.

The term "plasma CVD process" includes the plasma pulse CVD process in the context of this invention. The plasma pulse CVD process is even preferably used.

The coatings produced by means of plasma CVD processes are distinguished not only by a very high optical quality, but they are, in addition, also chemically, mechanically and thermally extremely stable. They owe these advantageous properties to the fact that they virtually have the properties of solid material in relation to stoichiometry and morphology.

The invention exploits the fact that the plasma CVD processes are, per se, eminently suitable for coating complicatedly shaped parts since they have a high scattering action. In these processes it is not necessary to rotate or move the substrates in some other way to achieve a uniform coating. Despite this advantage, it is hitherto only been possible to use plasma CVD processes for coating small-area, strongly arched substrates.

European Patent Specification 0.017,296 describes, for example, a plasma CVD process for producing spherical microlenses, according to which a glass plate is provided with approximately 35 μm deep recesses for receiving the lenses. During the coating which subsequently takes place, a plasma zone which extends right into the recesses is then produced over the entire glass plate. This has the consequence that the coating material is deposited not only on the surface of the glass plate but also in the recesses, it being possible to produce a desired reflective index profile in the deposited coating in a way known per se by altering the reaction gas composition during the coating. The coating is stopped, according to the abovementioned publication, only when the recesses are completely filled with coating material. In further process steps (plane grinding of the surface and bonding to a further coated plate so that in each case two hemispheres are combined to form a sphere), spherical lenses embedded in glass frames are produced from the coated glass plate.

The method described above cannot, however, be extended to the coating of strongly arched substrates having fairly large diameters ($\phi \gtrsim 5$ mm at the dome base), such as, for example, reflectors with a reflector face having a dome-like shape which have as a rule a diameter of at least 20 mm at the dome base for the most common applications, since the thickness of a plasma zone suitable for coating is normally limited to a few 10 mm above the face to be coated and the plasma is thus not capable of enclosing the entire body on the side to be coated, as is necessary for producing a uniform inside or outside coating. For greater thicknesses of the plasma region, the probability increases that particles will deposit as glass soot on the substrate surface and incorporate in the coatings deposited not only at the substrate/gas space interface, but in the entire gas space in a so-called homogeneous reaction. This impairs the coating quality so considerably that the coatings become unusable.

The process according to the invention is described below using the example of coating the inside surfaces of substrates which is of particular interest for producing reflectors. The comments below, are, however, valid without substantial restrictions also for coating the outside surface of substrates by the process according to the invention. In particular, the apparatuses described for inside coating can be converted for outside coating in a simple way be the reverse arrangement of the substrates and a suitable shaping of the displacement bodies. An exception is where the reaction takes place within two combined substrates.

According to the invention, a so-called displacement body is spaced and displaceably arranged with respect to the face to be coated in the semilaterally open cavity bounded by the arched substrate in order to inside-coat an approximately dome-shaped substrate, referred to herein also as a dome or dome-like substrate. With the aid of the displacement body, the thickness of the gas layer to be reacted above the face to be coated is adjusted so that the extent of the homogeneous reaction ("glass soot formation") taking place during a plasma phase remains harmless for the desired coating quality, such as its reflective properties. In other words, the homogeneous reaction is maintained at a level such that the coating formed does not significantly scatter light. Glass soot is responsible for light scattering and preferably less than 1% glass soot, with respect to the deposited layer, is formed.

As a rule, the coating quality is sufficiently good to produce dielectric interference coating systems for reflectors if the spacing does not exceed 20 mm. On the other hand, the spacing should not be made less than 2 mm, since excessively high requirements are otherwise imposed on the accuracy of positioning the displacement body.

To carry out the coating, the reaction gases are fed into the reaction space in a manner known per se and the coating-forming plasma is fired.

The reaction gases used in PCVD processes are normally metal chlorides, organometallic compounds, oxygen, nitrogen and ammonia. To deposit the "hard" $SiO_2/TiO_2$ coating systems suitable for reflectors having cold-light silvering, it is possible to use, for example, $SiCl_4$ and $TiCl_4$ as reaction gases in addition to oxygen. The use of $SiCl_4$ has, however, the disadvantage that high substrate temperatures are necessary to prevent the incorporation of chlorine into the coatings. To coat domes by the process according to the invention, the use of hexamethyldisiloxane instead of $SiCl_4$ is preferred since the necessity for high substrate temperatures thereby vanishes and the process operates more economically.

To excite the plasma, all the methods known for this purpose are suitable, such as, for example, high-frequency, low-frequency, microwave, direct-voltage or pulsed direct-voltage excitation. The high- and low-frequency excitation can take place either capacitively or inductively.

In the process according to the invention, microwave excitation is preferred. Microwave excitation has the advantage that the risk of radiation damage to the coatings deposited is low, that the plasma power necessary for a process decreases with increasing frequency, that the launch efficiency is high and that microwave plasmas can be operated over wide pressure ranges (about $10^{-3}$ to 50 mbar).

In addition to these more general advantages applying to every PCVD process, the use of a microwave plasma for the process according to the invention is also particularly beneficial because, as a result of the limitation of the plasma region to volumes as small as possible, less powerful, inexpensive components, such as, for example, magnetrons, can be used as microwave generators. Thus, for example, in the coating of small domes having a diameter at the dome base of not more than 50 mm, the electrical power supplied by a single magnetron (100 W) can be sufficient to fire and maintain the plasma regions in at least 4 domes.

Glass substrates are preferably used for the inside coating of reflectors. Although plastic substrates can be in principle be coated equally as well by the process according to the invention, most plastics are less suitable for use as reflectors owing to their generally low thermal load-carrying capacity. In addition, the adhesion of the above described coating systems to glass is better than to plastic, in particular in the case of thermal loading.

Owing to the simpler positioning of the displacement body, the process according to the invention is suitable, in particular, for coating strongly arched substrates having a rotationally symmetrical shape such as, for example, domes or ellipsoidally or parabolically shaped bodies. With suitable shaping of the displacement body, however, irregularly shaped substrates, for example elongated arched substrates such as those used, for example, to produce dental mirrors, can also be coated without difficulty.

The process according to the invention makes it possible to coat a plurality of substrates simultaneously in one receptacle. To limit the reaction space volume, it is expedient here to countersink the domes in suitable recesses in a substrate mounting or, for example, in the base plate of the receptacle with their openings facing the interior of the reaction space. The cover plate of the receptacle can then advantageously be provided with an arrangement, matching the arrangement of the substrates, of bulges which, when the receptacle is closed, sink into the cavities, bounded by the substrates, as displacement bodies. Preferably, however, the displacement bodies are arranged to be variable in spacing with respect to the face to be coated by means of suitable mountings in order to adjust the thickness of the gas layer to be reacted. In this arrangement, the fresh reaction gases and the reaction gases depleted in coating material can be passed through the receptacle in a continuous gas stream essentially parallel to the faces to be coated through gas inlet and gas outlet openings which are situated in the side walls of the receptacle and are connected to one or more gas sources or a vacuum pump outside the receptacle.

In the case of capacitive excitation in which the covering plate and base plate of the receptacle are composed of a metal, the arrangement described above is suitable, in particular, also for depositing metallic coatings or mixed coatings of a metal and a dielectric, it also being possible, for example, for the transition from a purely metallic to a purely dielectric coating to take place continuously.

To produce reflectors having cold-light mirrors, as a rule, glass substrates shaped by pressing are used which are already provided with lamp connecting pieces, the so-called dome necks, for the electrical connections on their outer arched surface. Before the coating, the substrates are subjected to a cleaning procedure in which certain cleaning processes, for example those in which a cleaning liquid flows through the dome, make it necessary to remove, after pressing, the seal resulting at the dome neck from shaping.

In the coating of these so-called open domes, the opening in the dome neck can advantageously be used to supply each individual dome separately with fresh reaction gases during the deposition process. The coating thickness gradient from dome to dome which otherwise normally occurs as a consequence of the increasing depletion of the reaction gases in coating material in the gas flow direction is thereby avoided. The consumed reaction gases can be drawn off through openings in the side walls of the receptacle.

With closed domes, it is advisable to supply the fresh reaction gases to each individual dome through suitable channels in the displacement bodies. However, the open domes can also be provided with fresh reaction gases in this way.

If a plurality of substrates is coated simultaneously in one recipient, it is unavoidable that the walls of the receptacles are also coated in addition to the substrates. This not only results in a higher consumption of coating material but also in the disadvantage that, depending on coating thickness and material in a coating process and depending on the requirements imposed on the coating quality, the receptacle has to be subjected to an expensive cleaning procedure. This cleaning cannot always be carried out so thoroughly that residues of the old coatings do not in fact continue to adhere to the walls. These residues may possibly detach themselves from the walls in the course of further coating processes and deposit in the form of small particles on the inside faces of substrates to be coated and thus make their coatings unusable.

In order to avoid these problems, every substrate is individually coated in a preferred process variant and is itself used at the same time as part of the vacuum vessel. For this purpose, the arched substrate is combined with, and gas-tightly connected to, a suitably dimensioned, semilaterally open vessel, for example to a glass tube with one of tis ends sealed by melting, to form a closed vessel. Provided both parts are composed of glass, it is, in general, sufficient for the gas-tight connection to simply apply the polished edges to each other and to evacuate the vessel. The sealing is improved still further if O-rings of fluoroelastomers or silicone rubber are laid between the edges of the two subvessels. The use of sealing rings of organic material is, however, limited to substrate temperatures on exceeding approximately 200° C., fluorocarbon resins and fluoroelastomers being able to withstand continuous temperatures of up to 260° C.

In the process variant described above, the plasma region is expediently limited to the interior space of the dome during coating. The vessel part applied to the dome is thereby only slightly coated at the same time and can be reused either without or, if necessary, after a simple cleaning procedure for coating further domes. Since one part of the vacuum vessel is always renewed in any case with each change of substrate, the cleaning expenditure is substantially reduced compared with coating a substrate situated in a receptacle. In order to be completely certain that the coating is not nevertheless impaired by coating particles which detach themselves from the wall of the reused vessel part, the vacuum vessel is expediently arranged so that the dome is situated as vertically as possible above the reused vessel part during coating.

The displacement body is expediently spaced and mounted displaceably with respect to the substrate face to be coated on the wall of the vessel, for example, by means of a glass tube which is fused into the vessel wall and whose free end carrying the displacement body faces the interior space of the substrate. The displacement body may, for example, be screwed or plugged onto the end of the glass tube. This has the advantage that, in the case of a substrate change, the distance of the displacement body from the inside face of the substrate can easily be adjusted.

Depending on whether a dome with a closed or an open dome neck is to be coated, different conditions result for the feeding of the reaction gases.

When coating a closed dome, the reaction gases are passed in a continuous gas stream along the face to be coated through a gas inlet or gas outlet opening in the vessel part applied to the dome and a further gas outlet or gas inlet opening in the displacement body on the side which faces the face to be coated and which is connected via a channel in the displacement body to a gas source or to a vacuum pump outside the vacuum vessel. Advantageously, the displacement body is mounted for this purpose so that the channel in the displacement body is continued in the glass tube leading to the outside and carrying the displacement body.

For flow engineering reasons, it is beneficial to choose the gas flow direction so that the fresh reaction gases are introduced through the channel in the displacement body into the reaction space and the reaction gases depleted in coating material are removed through a gas outlet opening in the vessel part applied to the dome, with the reverse gas flow, it is difficult owing to the pressure drop in the nozzle of the displacement body, to maintain in the receptacle the low pressure necessary for coating.

The gas flow direction described above is recommended, in particular, also if substrates not having a rotationally symmetrical shape are to be coated. Since it is very difficult in this case to create equal flow conditions for the reaction gases at every point of the face to be coated, it is expedient, to achieve uniform coating, to feed the fresh reaction gases into the reaction space via a multiplicity of gas inlet openings which are distributed evenly over the end face of the displacement body situated opposite the face to be coated and connected to a gas source outside the vacuum vessel via a central channel in the displacement body.

The conditions become particularly simple when coating open domes. In this case, the gas stream does not have to be fed through the displacement body, but it is possible to connect the open dome neck itself to suitable feed lines to a gas source or a vacuum pump. In this embodiment, there is no preferred direction for the gas flow direction.

It may be advantageous to seal the dome neck in the case of "open" domes and to carry out the coating in an analogous way to the closed domes. The apparatus for coating closed domes can be scaled up more simply for mass production, since each vacuum vessel only has to be provided with a single seal.

In the case of "open" domes which are not unduly large, for example having a diameter of not more than 20 mm at the dome base, the reaction space volume is, in general, still small enough for the coating still to be carried out without displacement body. According to the invention, provision is made in this case for carrying out the coating in a receptacle which is composed of two domes combined to form a vacuum vessel and connected gas-tightly to each other. In this case, the reaction gas stream is passed through the open dome necks. In this process variant, the coating becomes the more uniform the more the shape of the substrates is equivalent to a hemisphere, if a pulse process is carried out.

In the process according to the invention, the substrate temperatures customary in PCVD processes can be established. Limits in this connection are primarily set by the heat resistance of the substrate material. It is known that higher substrate temperatures bring about a greater density of the deposited material and are therefore preferably used if particular requirements are imposed on the mechanical, thermal and chemical stability of the coatings.

When coating domes for producing reflectors, substrate temperatures of between room temperature and 200° C. are preferably established. The coating quality is thereby sufficiently good for use as reflectors and the process operates economically. A further advantage is that substrate temperatures in this order of magnitude can be established without additional heating solely by a plasma pretreatment, for example an $O_2$ gas-discharge, which is normally used before the actual coating to condition the substrate face to be coated. The duration of the plasma pretreatment determines at the same time the level of the substrate temperature reached.

The displacement body is expediently manufactured from a material which is dimensionally stable and usable in vacuum at least up to the chosen substrate temperature. Usable in vacuum means in this connection that no outgassing which affects the process adversely must occur from the material at the chosen substrate temperature. This relates both to a possible pressure deterioration and to the enrichment of the atmosphere in the recipient with a species which impairs the coating quality.

For the coating described above it is sufficient if the displacement body is composed of a material which is dimensionally stable and usable in vacuum up to a temperature of about 200° C. and resistant to the species present in the discharge. Materials which meet these requirements are, for example, metallic materials such as, for example, Al, Ti, stainless steel, or dielectric materials such as, for example, glass, ceramic, glass ceramic or even plastics, in particular fluorocarbon resins, preferably polytetrafluoroethylene.

The coating is preferably carried our at a pressure in the receptacle of 0.03 to 10 mbar. At a pressure of less than 0.03 mbar, the coating rate decreases so considerably that the process no longer functions economically. In addition, the plasma may not be sufficiently stable with the result that the more expensive magnetic field assisted processes have to be used. Although a high pressure is advantageous with respect to the coating rate, the probability of the occurrence of the homogeneous reaction increases with increasing pressure, with the result that the spacing between displacement body and substrate has to be suitably reduced. It has proved advantageous not to increase the pressure beyond 10 mbar in order not to have to operate with unduly small spacings.

In PCVD processes, the plasma is normally produced with such low power that only about 1 to 4% of the reaction gases are converted into coating material. This yield is a compromise between the cost effectiveness of the process and the risk of an uneven coating as a consequence of an unduly severe depletion of the reaction gas in coating material on being passed along the face to be coated.

Preferably, the coating is carried out with a plasma pulse CVD process in which the thickness of the coating deposited on an element of area of substrate face during one plasma pulse is determined at every point of the substrate in a manner known per se by the number of coating forming particles situated above the element of area in the gas volume. As a result, it is possible to achieve not only an improved utilisation of the reaction gases, including even complete depletion in coating material during one plasma pulse, and, resulting therefrom, a very much higher deposition rate than is the continuous-wave process, but the plasma pulse CVD process also has the further advantage, that with suitable shaping or arrangement of the displacement body, a specified axial and azimuthal layer thickness profile can be produced.

Thus, it is, for example, generally desirable, when domes are used as reflectors, that, in a plane view of the dome from the front over the entire reflector face, a uniform reflection hue is produced despite different angles of incidence of a light delivered by a light source centrally arranged in the dome.

Bearing in mind the fact that the interference phenomena resulting in a particular reflection hue are dependent on the optical path of the light on passing through the individual coatings of the dielectric coating system, the coating thickness profile necessary to produce a uniform reflection color can easily be determined as a function of the shape of the inside face of the substrate using simple geometric relationships and converted into a "spacing profile" between the inside face of the substrate and the displacement body. In this connection, it is advisable to allow for the pressure loss of the reaction gases in the flow direction when determining the spacing profile.

The advantages achievable with the invention are, in particular, that a tried coating process which is known for its advantages, the plasma CVD coating process, can now also be used for the inside coating of strongly arched substrates, for example for the production of reflectors. The use of a PCVD process makes it possible to provide strongly arched substrates having virtually any shape with a uniform coating of high optical quality and also mechanical, chemical and thermal stability without substrate movement, it being possible to superimpose a specified axial or azimuthal coating thickness profile by suitably shaping the displacement body if a plasma pulse process is used.

In the individual coating of a substrate, virtually no further face is coated apart from the substrate, which is, at the same time, also part of the reaction vessel, and the displacement body. The coating can be carried out in a readily controllable and inexpensive pressure range. The conversion of the reaction gases into coating material can be virtually complete, resulting not only in the best possible utilization of the reaction gases, but also in high coating rates. A local irregularity in the excitation field, for example, the microwave field, does not necessarily result in a deviation in the coating thickness from the specified value in the case of the plasma pulse process, provided the field strength exceeds a (readily determinable) threshold value at which the conversion into coating material reaches its maximum value.

The invention and the achievable advantages are described below in greater detail with reference to exemplary schematic drawings and two exemplary embodiments.

Figure 1:
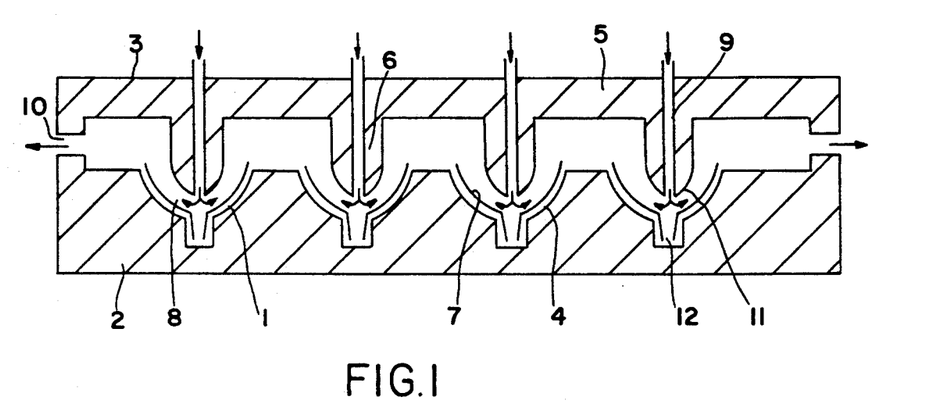
FIG. 1 shows a schematic longitudinal section representation of an apparatus for coating a plurality of domes in a receptacle using a plasma pulse process according to the invention.

In FIG. 1, a plurality of domes 1 can be seen which are arranged next to one another in a grid on the baseplate 2 of receptacle 3 for the purpose of coating using a plasma pulse process. In order to keep the volume of the reaction space as small as possible, the domes 1 are sunk into matching recesses 4 in the baseplate 2. The covering plate 5 of the receptacle 3 is provided with an arrangement of displacement bodies 6, which sink into the cavities 8 bounded by the dome inside faces 7 to be coated, so as to match the arrangement of the recesses 4 in the baseplate 2. For the purpose of supplying the reaction gases, each displacement body 6 is provided with a central channel 9 which can be connected to a gas source not shown in the figure. Provided in the side walls of the receptacle 3 is a plurality of gas outlet openings 10 through which the reaction gases depleted in coating material can be sucked off by means of a vacuum pump, which is not shown.

The spacing between the dome inside face 7 and the side 11, situated opposite it, of the associated displacement body 6 is dimensioned so that the particle formation occurring in the gas space between the two faces during a plasma discharge does not impair the coating quality. In addition, in the embodiment shown, the displacement bodies 6 are arranged to be more widely spaced at the end of every dome 1 on the gas outlet side, i.e., at the dome edge, than at the dome neck situated on the gas inlet side in order to compensate for the drop in pressure in the reaction gases in the flow direction for the purpose of producing a uniform coating.

The means for producing the plasma zone in the receptacle are known per se and are not therefore shown in the figure. Thus, the plasma can be excited, for example, capacitively, in a manner such that both the baseplate and the covering plate of the receptacle are composed of a metal and a voltage is applied between the two plates. With this arrangement, both dielectric and metallic coatings or mixed coatings of dielectric and metallic materials can be deposited. It is equally possible to provide an arrangement of microwave aerials above the covering plate or below the baseplate of dielectric material and to fire and maintain the plasma by irradiation with microwave energy.

To carry out the coating process, the reaction gases are fed in a continuous gas stream through the displacement bodies 6 into the cavities 8 bounded by the dome inside faces 7 and the displacement bodies 6. In this process, after entering the cavity bounded by the dome, the gas stream is deflected at the dome neck 12 and directed laterally out of the dome 1 again along the face to be coated and past the displacement body 6 (the continuously drawn arrows in the figure indicate the gas flow direction). As a result of exciting a gas discharge, coating material is deposited on the dome inside face 7, the surface of the displacement body 6 and on the entire inside wall of receptacle 3. The time duration between two plasma pulses and the flow rate of the gas are expediently matched to each other, as is normal in plasma pulse CVD processes, in a manner such that the reaction space above the dome inside face is completely filled with fresh reaction gases again before each plasma pulse.

Individual layers having different compositions can be deposited on top of one another by altering the gas composition in a manner known per se.

Figure 2:
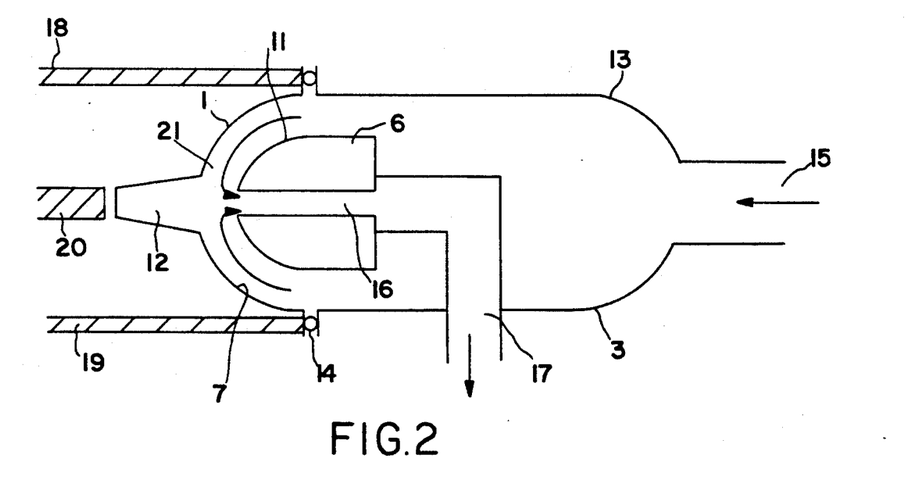
FIG. 2 shows a schematic longitudinal sectional representation of an apparatus for coating a single dome having a closed dome neck.

To heat the substrates, the apparatus for coating individual domes. It can be seen that in each case a dome 1 is combined with semilaterally open vessel 13 to form a receptacle 3. A gas-tight connection is provided by a sealing ring 14 situated between the edges of the two vessel parts.

The apparatus in FIG. 2 is suitable for coating a dome having a closed dome neck. The reaction gases are supplied through a gas inlet opening 15 in the vessel parts 13 applied to the dome.

The reaction gases are fed past the displacement body 6 along the face to be coated to the dome neck 12, deflected at that point and sucked off via the channel 16 in the displacement body 6 and the angled glass tube 17 which supports the displacement body 6 and which is connected to a vacuum pump which is not shown. To mount the displacement body, it is also possible to use a straight glass tube axially arranged in the vacuum vessel and fused into the vessel wall situated opposite the dome. The gas supply can take place in this case, for example, through gas inlet openings grouped around the fusion point. The gas flow direction described above is advantageous if a blockage of the channel 16 with coating material has to be feared.

In the apparatus shown, the plasma is excited by irradiation with microwave energy. For this purpose, there is mounted on the dome 1 a waveguide 18 whose external conductor 19 extends right up to the edge of the dome and whose internal conductor 20 terminates immediately in front of the closed dome neck 12. With this arrangement, the plasma region can easily be limited to the reaction space 21 bounded by the dome inside face 7 and the end face 11 of the displacement body 6. It is true that under these circumstances the plasma region partly still extends into the channel 16 in the displacement body; however, owing to the fact that only the reaction gases depleted in coating material are fed through this channel, a gradual blockage of the opening and of the channel with coating material is substantially avoided.

The coating is in other respects carried out as described above.

Figure 3:
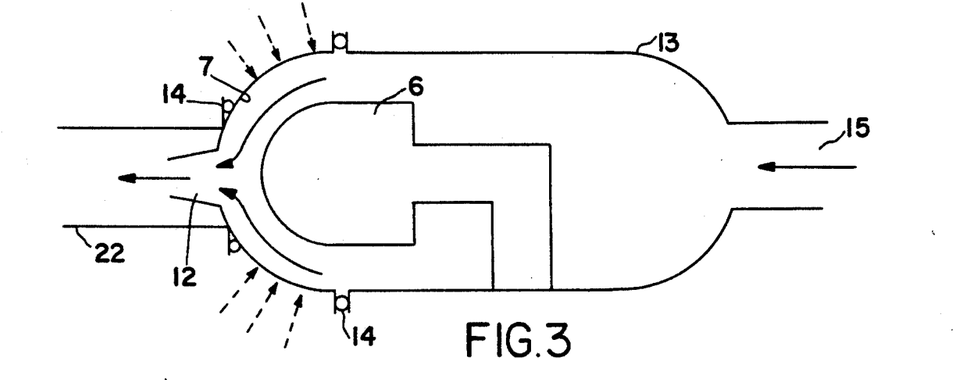
FIG. 3 shows a schematic longitudinal sectional representation of an apparatus for coating a single dome having an open dome neck.

FIG. 3 shows an apparatus for coating a dome with an open dome neck. In this embodiment, the coating is carried out essentially in an analogous manner to the embodiment in FIG. 2. One difference is that the consumed reaction gases are removed not through the displacement body 6 but through the open dome neck 12. For this purpose, a glass tube 22 which is connected to a vacuum pump is mounted on the dome 1 from the outside and reliably sealed against the external space by means of a sealing ring 14. The plasma can be excited, for example, by irradiation with microwave energy (see arrows drawn with broken lines) by means of microwave aerials, not shown, which are laterally grouped around the dome.

Figure 4:
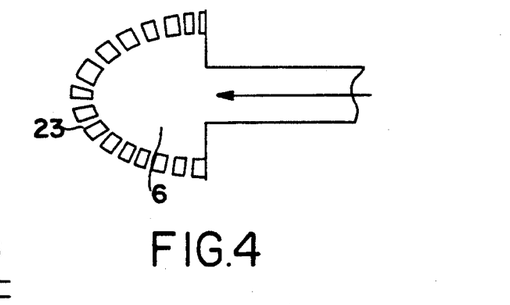
FIG. 4 shows a schematic longitudinal sectional representation of a displacement body which is designed as a gas spray for coating a substrate of nonrotationally symmetrical shape.

The displacement body 6 in FIG. 2 does not necessarily have to have a central channel 16 but may be provided, as shown in FIG. 4, with small channels 23 ($\phi \gtrsim 1$ mm) evenly distributed over the entire face (e.g., frit).

Figure 5:
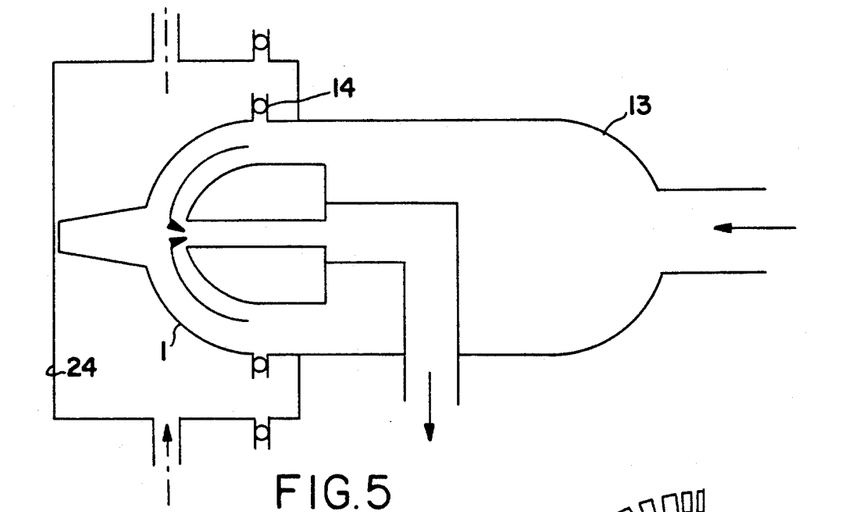
FIG. 5 shows the apparatus from FIG. 2, in which the dome is surrounded by a further vacuum vessel to avoid damage due to leaks.

In order to avoid failures due to leaks at the dome seal 14, it may be beneficial, as shown in FIG. 5, to install above the dome a second vacuum vessel 24 to which a gas is fed which neither attacks the dome material nor participates itself in the coating in a plasma (for example $O_2$). With the size of the leak unaltered, the amount of gas flowing into the dome 1 will be the smaller, the smaller the pressure difference between inside and outside of the dome. Advantageously, the pressure in the vacuum vessel 24 is adjusted precisely to a height at which a plasma coating of the dome inside face 7 ($p \approx 50$ to 100 mbar).

The measurement described above may be important if many domes are coated simultaneously from the same gas supply system. Without this measure, a single leak may endanger the coating of all the domes.

Figure 6:
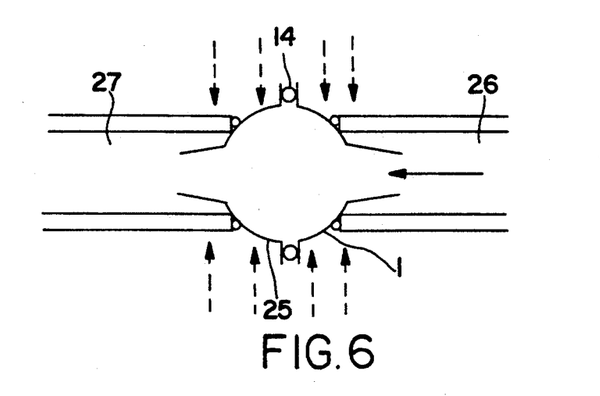
FIG. 6 shows two small, hemispherical domes which have been combined to form a vacuum vessel for coating without a displacement body.

In FIG. 6 two small, hemispherical domes 1 can be seen which are combined to form a vacuum vessel 25. As a result of the spherical shape of the vacuum vessel 25, the same amount of gas is situated above each element of area of substrate surface. A uniform coating is consequently ensured if a plasma pulse CVD process is used, even without displacement body. The volume bounded by the two domes is small enough to be able to exclude an impairment of the coating quality by a homogeneous reaction in the gas space.

In the embodiment shown the gas flow takes place through the open dome necks 12 to which, in an analogous manner to the apparatus in FIG. 3, gas inlet and outlet tubes 26, 27 are applied in a gas-tight manner. In this variant, too, the plasma can be excited in a simple manner by irradiation with microwave energy by means of microwave aerials grouped laterally around the vacuum vessel.

As can readily be seen from the figures, the coating bodies and the displacement bodies are in principle mutually replaceable. Thus, for example, in the embodiment shown in FIG. 3, the dome to be coated can be transferred to the position of the displacement body for the purpose of outside coating. In order to avoid inside coating taking place simultaneously with the outside coating, it is only necessary to ensure that there is no coating material in the inside space of the dome. For this purpose, the dome may be, for example, part of a further vacuum vessel arranged in the receptacle.

The apparatus shown in FIG. 2 is particularly suitable, for coating domes in mass production, since the vacuum vessel has only a single vessel. It is advisable to install a plurality of the vessels applied to the domes permanently next to one another in a grid. The gas supply, and also the connection to a vacuum pump, can take place via common feedline systems.

For the purpose of coating, the domes are mounted on the permanently installed vessel halves, a sealing ring being used if necessary, and the vacuum vessels thus formed are evacuated. The plasma can be excited in a simple manner by irradiation with microwave energy, for example, by means of waveguides mounted on top of the domes. After coating, the vacuum vessels are vented, whereafter the coated domes can be simply lifted off and replaced by new substrates.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius and unless otherwise indicated, all parts and percentages are by weight.

The entire disclosures of all applications, patents and publications, cited above and below, and of corresponding application Federal Republic of Germany P 40 08 405.1-45, filed Mar. 16, 1990, are hereby incorporated by reference.

EXAMPLE 1

The pressed edge of a dome made of Schott Glaswerke borosilicate glass No. 8486 having a diameter of 50 cm is applied to a tube also having a diameter of 50 cm. An Viton O-ring lying on the polished tube end ensures a vacuum-tight connection between tube and dome. The tube is manufactured from a dielectric material, in the present case from Schott Glaswerke borosilicate glass No. 8330. The reaction gases can be fed into the reaction space formed in this way through a laterally fused-in glass tube having a diameter of 10 mm. The consumed reaction gases are removed through a taper at the tube end. The dimensions can be inferred from FIG. 2 which is drawn on a scale of 1:1. The gas inlet tube is angled on the axis of the larger tube; it is terminated by an axially drilled Teflon displacement body. The diameter of the bore is 5 mm, but this value is not very critical. The reaction gases are able to enter the reaction space through this bore. The displacement body is shaped so that the spacing of its surface from the inner surface of the dome is equally large everywhere, namely 7 mm, apart from the region of the dome neck.

Before coating, an $O_2$ gas discharge is fired in the reaction space formed by dome and displacement body in order to condition the dome inside face to be coated. The desired substrate temperature is established by means of the intensity and duration of said $O_2$ gas discharge. The microwave energy is radiated from above onto the dome from a microwave aerial.

The parameters for the $O_2$ gas discharge are specified below:

| | |
|---|---|
| $O_2$ mass flow (ml/min) | 200 |
| Pressure in receptacle (mbar) | 0.7 |
| Pulse duration (ms) | 0.6 |
| Inter-pulse period (ms) | 20 |
| Microwave frequency (GHz) | 2.45 |
| Mean microwave power (W) | 75 |
| Substrate temperature (°C.) | 90 |

The microwave irradiation is then interrupted and the gas mixture is adjusted for producing the first $TiO_2$ coating. This gas mixture is first allowed to flow into the bypass line for about 0.5 min; the mass flows are then stationary. During this time the dome cools only insignificantly.

The $TiO_2$ coating is produced with the following parameters:
$TiCl_4$ flow rate (ml/min): 3
Coating time for a $\lambda/4$ coating for $\lambda=550$ nm(s) 25
The other parameters are unchanged compared with those of the $O_2$ gas discharge.

The microwave irradiation is then interrupted and the gas mixture adjusted for producing the first $SiO_2$ coating; the $SiO_2$ coating is produced with a stationary mass flow (see above).

The process parameters are as follows:
$C_6H_{18}OSi_2$ flow rate (ml/min): 3.6
Coating time or a $\lambda/4$ coating for $\lambda=550$ nm(s): 25
The other parameters are unchanged compared with those of the $O_2$ gas discharge.

A total of 31 $TiO_2/SiO_2$ $\lambda/4$ coatings are applied alternately and their thicknesses are adjusted on the basis of known optical criteria so that the interference coating system produced is a so-called cold-light mirror.

EXAMPLE 2

A dome composed of Schott Glaswerke borosilicate glass No. 8486 having a diameter of 50 mm rests on the lower electrode of a 13.56 MHz plasma generator in a receptacle. The upper electrode is designed as a gas spray and displacement body. The spacing of the displacement body from the substrate inside face to be coated is 15 mm at every point on the substrate.

The receptacle is evacuated to 0.03 mbar and the dome is pretreated with an $O_2$ gas discharge at this pressure. Then coating is carried out at the same pressure; for this purpose, a mass flow of [lacuna] 1 ml/min $TiCl_4$ and 35 ml of $O_2$ is established and a $TiO_2$ coating is applied at an HF power of 50 W. A flow rate of 0.5 ml.min $C_6H_{18}OSi_2$ (hexamethyldisiloxane) and 35 ml of $O_2$ is then established and an $SiO_2$ coating is applied at an HF power of 50 W.

31 $TiO_2/SiO_2$ /4 coatings are applied alternately whose coating thicknesses are adjusted on the basis of known optical criteria so that the interference coating system is a cold-light mirror.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A plasma-chemical vapor deposition apparatus for coating of a single domed substrate by reaction of a gas layer over the domed substrate comprising a vacuum vessel formed by the domed substrate and an open vessel part which are combined and gas-tightly connected at the edges, a displacement body and means for holding the displacement body in the vessel part, wherein said displacement body is spaced so as to limit the gas layer to be reacted in the vacuum vessel and arranged displaceably with respect to the substrate face to be coated, said displacement body also having a channel which opens on the side opposing the substrate face to be coated and continues to at least one first opening in the vessel part which is a gas inlet or outlet connected to a gas source or a vacuum pump outside the vacuum vessel, respectively, at least one further second opening in the vessel part which functions as a gas inlet or outlet opposite to the first opening, wherein both openings are adapted to provide a continuous flow of the reaction gases along the substrate face to be coated, and means for exciting a plasma zone in the gas layer to be reacted.

2. An apparatus according to claim 1, wherein a tube is let into the opening of the vessel part which is a gas outlet or gas inlet connected to a vacuum pump or gas source, respectively, for the purpose of supplying or removing reaction gases, said tube having one end projecting from the vacuum vessel and the other end terminating at the channel in the displacement body, which continues in the direction of the tube to the substrate face to be coated, wherein said displacement body is arranged so that it can be displaced in the axial direction.

3. An apparatus according to claim 2, characterized in that the tube is connected to a gas source for the purpose of supplying the reaction gases.

4. An apparatus according to claim 2, characterized in that the tube is connected to a gas source for the purpose of supplying the reaction gases and the displacement body is designed as a gas spray on the side opposing the substrate face to be coated.

5. A plasma-chemical vapor deposition apparatus for coating the inside of a single substrate having an open dome neck by reaction of a gas layer over the substrate, comprising a vacuum vessel formed by the domed substrate and an open vessel part which are combined and gas-tightly connected at the edges, a displacement body which is spaced so as to limit the gas layer to be reacted in the vacuum vessel and arranged displaceably with respect to the substrate face to be coated, means for mounting the displacement body in the vessel part, an opening in the vessel which is a gas inlet or gas outlet for supplying or removing the reaction gases, respectively, which can be supplied or removed through the open dome neck, and means for exciting a plasma zone in the gas layer to be reacted.

6. Apparatus according to claim 5, characterized in that the displacement body is composed of a material which is dimensionally stable and usable in vacuum up to a temperature of 200° C.

7. Apparatus according to claim 6, characterized in that the displacement body is composed of a metallic material which is Al, Ti, or stainless steel, or a dielectric material which is glass, ceramic, or glass ceramic, or a plastic which is a fluorocarbon resin.

* * * * *